United States Patent [19]

Huang et al.

[11] 4,237,432
[45] Dec. 2, 1980

[54] SURFACE ACOUSTIC WAVE FILTER WITH FEEDFORWARD TO REDUCE TRIPLE TRANSIT EFFECTS

[75] Inventors: Marshall Y. Huang, Rancho Palos Verdes; Albert J. Grote, Venice; Kuo-Hsiung Yen, Manhattan Beach, all of Calif.

[73] Assignee: TRW Inc., Redondo Beach, Calif.

[21] Appl. No.: 17,215

[22] Filed: Mar. 5, 1979

[51] Int. Cl.$^3$ .......................... H03H 9/64; H03H 9/25
[52] U.S. Cl. ................................... 333/194; 333/151; 333/193
[58] Field of Search ................................ 333/150–155, 333/190–193; 310/313

[56] References Cited
U.S. PATENT DOCUMENTS 3,908,137  9/1975  Hunsinger et al. ............. 333/152 X Primary Examiner—Marvin L. Nussbaum
Attorney, Agent, or Firm—Donald R. Nyhagen; John J. Connors

[57] ABSTRACT

A surface acoustic wave filter device having an input transducer and an output transducer, in which triple transit effects are minimized by the addition of a second output transducer spaced from the input transducer, preferably by a distance three times the spacing between the normal input and output transducers, to duplicate the triple transit path length. A triple transit signal is thereby simulated at the second output transducer, is adjusted in amplitude and phase, and is applied to a summing circuit in which the simulated triple transit signal is subtracted from a signal derived from the original output transducer, to effectively cancel the triple transit component.

4 Claims, 5 Drawing Figures

SURFACE ACOUSTIC WAVE FILTER WITH FEEDFORWARD TO REDUCE TRIPLE TRANSIT EFFECTS

BACKGROUND OF THE INVENTION

This invention relates generally to acoustic wave devices, and, more particularly, to surface acoustic wave bandpass filters for use in a variety of applications, particularly in the communications field.

Surface acoustic wave (SAW) devices are a relatively new class of devices that utilize the propagation of surface acoustic waves in various piezoelectric materials, at ultrasonic frequencies. In recent years, such devices have been advanced to an extremely practical stage of development, and they are now widely used in communications and signal processing systems. The underlying reason that ultrasonic waves provide the basis of a useful class of filters, is that such waves travel with negligible loss in suitable solids, at typical velocities of $10_3$ to $10_4$ meters per second. These velocities correspond to operating frequencies in the range 30 to 800 megahert (MHz) for practical surface wave filters.

When an acoustic wave is propagated along the surface of a piezoelectric material, a traveling electric field is also generated on the surface. This field also extends significantly above the surface, and can interact with appropriately constructed metal electrodes disposed on the surface. Typically, such electrode structures are formed by photolithographic techniques, and take the form of interdigital transducers. An interdigital transducer is a two-terminal device comprisng a plurality of parallel metal strips or fingers, uniformly spaced on the surface of the piezoelectric substrate. The fingers are connected in alternating fashion to two terminals strips, having the general appearance of two combs with their teeth interleaved but not touching. When a voltage is applied across the terminals of an interdigital transducer, electric fields are generated within the substrate, and these generate corresponding stress patterns as a result of the well known piezoelectric effect. If the voltage applied to the terminals is an alternating signal of suitable frequency, the value of which is dictated by the transducer finger spacings, elastic surface waves are launched in two opposite directions, perpendicular to the transducer strips. The transducer is then said to be functioning as a transmitting transducer, or an input transducer. A similarly structured receiving or output transducer can convert the traveling surface waves propagated from the transmitting transducer back into an alternating electrical signal.

Since an interdigital transducer will operate only at frequencies within a relatively narrow range, determined by the transducer geometry, a surface acoustic wave device comprising a pair of such transducers provides a highly effective bandpass filter. Further background information on surface wave filters and related devices can be obtained in any of the large number of publications. For example, a book entitled "Surface Wave Filters, Design, Construction, and Use", edited by Herbert Mathews, and published by John Wiley and Sons, New York (1977), contains a good deal of useful background material on surface acoustic wave devices, as well as a comprehensive bibliography on the subject.

The frequency response characteristics of an interdigital transducer are essentially those of a bandpass filter having a relatively low insertion loss over its pass band. Consequently, a good bandpass filter can be constructed utilizing a pair of interdigital transducers mounted on the surface of a piezoelectric substrate, and the characteristics of such a filter will be determined largely by the geometry of the transducers. More specifically, the finger spacing of the transducers determines the mid-band frequency of the filter, and the number of fingers determines the bandwidth. The time delay from input to output of the filter is, of course, determined by the spacing between the input and output transducers.

A well known source of distortion in surface acoustic wave filters is due to a phenomenon referred to as the triple transit effect, or triple transit echo. Part of the signal received by the output transducer from the input transducer will be reflected back toward the input transducer. The magnitude of the reflected wave will depend in part on the degree of matching between the characteristic impedance of the receiving transducer and the impedance of the electrical load circuit to which it is connected. When the transducer is optimally matched with its load, i.e., matched for maximum power transfer, the magnitude of the reflected wave is at a maximum. Part of the reflected signal will be again reflected back from the input transducer toward the output transducer. Accordingly, the principal or intended output signal from the output transducer will be distorted by a triple transit echo signal that is delayed in time by twice the transit time of the principal signal. The triple transit echo results in significant ripples on both the amplitude characteristic and the time delay characteristic of the filter, both plotted with respect to frequency.

The most straightforward technique to reduce the triple transit effect is to mismatch the transducer's load impedance, and thereby increase the insertion loss of the filter. For every one decibel (dB) increase in the insertion loss of the filter, there is a 2 dB reduction in the triple transit echo signal. Naturally, this added insertion loss is usually viewed as a disadvantage in filter design, and other techniques for reduction of the triple transit effect have been sought.

One known technique for reducing the triple transit effect is to add a third transducer spaced from the input transducer by a distance one-quarter wavelength greater than the distance to the normal output transducer. The resultant waves reflected from the normal output transducer and the third transducer tend to cancel and thereby reduce the triple transit effect. However, this solution is not easy to implement at higher frequencies, because manufacturing tolerances make it difficult to obtain an extremely accurate one-quarter wavelength spacing. Moreover, such a device cannot be tuned to operate over a range of frequencies.

It will be appreciated from the foregoing that, prior to this invention, there has been a need for a convenient and reliable technique for minimizing the effect of triple transit echo signals in surface acoustic wave filters. The present invention fulfills this need.

SUMMARY OF THE INVENTION

The present invention resides in an acoustic wave filter device in which the effects of triple transit echo are substantially reduced. Basically, and in general terms, the device of the invention includes an input transducer, a first output transducer disposed to one side of the input transducer, and an additional output transducer disposed to the opposite side of the input transducer and spaced therefrom by approximately three times the spacing between the first output transducer and the input transducer. The additional transducer is designed to have an insertion loss slightly less than the path loss of the triple transit echo signal. The device of the invention further includes means for adjustably attenuating the output of the additional output transducer, means for adjustably phase-shifting the output from the additional output transducer, and means for adding the output signal derived from the first output transducer to the attenuated and shifted signal derived from the additional output transducer, to produce an output signal in which the triple transit component has been substantially suppressed.

In the device of the invention, the signal obtained from the additional output transducer traverses the same transmission path length as the triple transit echo signal, and is of slightly greater amplitude. The adjustable attenuation means and phase shifting means are used for fine adjustment of the amplitude and phase of the output signal derived from the additional output transducer, to provide a feedforward signal of equal magnitude and opposite phase to the triple transit echo signal. In this manner, the triple transit echo signal can be effectively cancelled. Moreover, the device can be fine-tuned, by adjustment of the attenuation and phase shifting means, for operation at a selected frequency within a narrow band.

It will be appreciated from the foregoing that the present invention represents a significant advance in the field of acoustic wave filter devices. In particular, it provides a hitherto unavailable technique for substantially reducing triple transit effects in bandpass filters. Other aspects and advantages of the present invention will become apparent from the following more detailed description, taken in conjunction with the accompanying drawings.

DESCRIPTION OF THE PREFERRED EMBODIMENT

Figure 1:
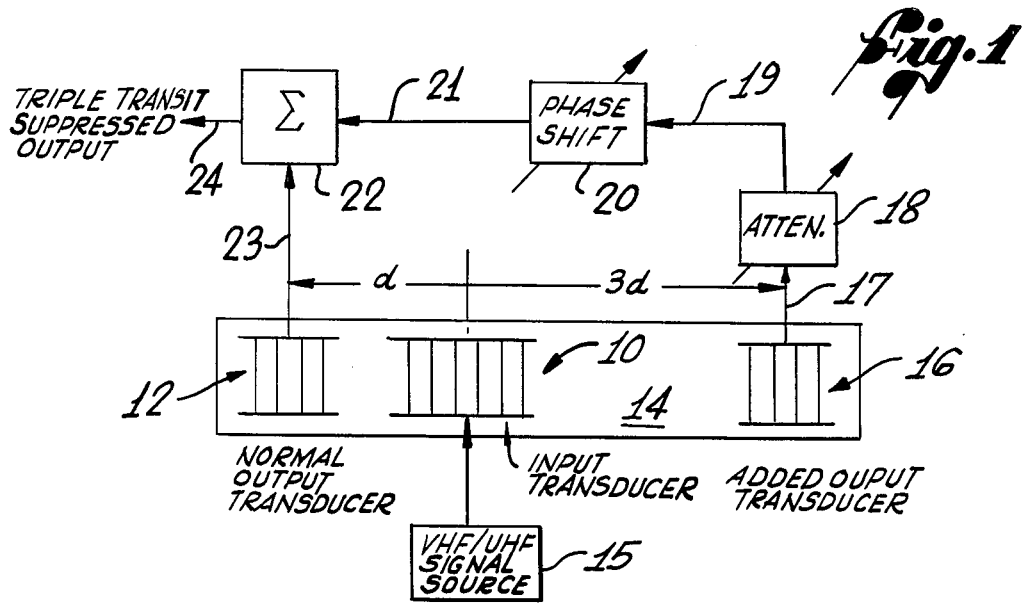
FIG. 1 is a diagrammatical view of an acoustic wave filter device constructed in accordance with the present invention.

As shown in the drawings for purposes of illustration, the present invention is concerned with the reduction of triple transit echo effects in surface acoustic wave filters. Basically, a surface acoustic wave filter device comprises an input transducer, indicated by reference numeral 10, and an output transducer 12 formed on the surface of a piezoelectric substrate 14 by conventional photolithographic techniques. When a signal, derived from a very-high-frequency or ultra-high-frequency signal source 15, is applied to the input transducer 10 and is received by the output transducer 12, it is subjected to a frequency-dependent insertion loss, as shown by way of example by curve A in FIG. 2.

Because some of the energy received at the output transducer 12 will be reflected back toward the input transducer 10, and some of this reflected energy will be again reflected back to the output transducer by the input transducer, a spurious response signal is ultimately received at the output transducer, after a delay equivalent to three transits of the substrate material between the input transducer and the output transducer. This spurious delayed response is referred to as a triple transit echo, or triple transit effect. It gives rise to a ripple in the frequency response characteristic of the filter, as is apparent from curve A in FIG. 2. The magnitude of the ripple is a function of the relative magnitudes of the original signal and the triple transit component. In practice, it is equal to approximately twice the insertion loss of the filter, plus a factor ranging from 6 to 12 dB. The triple transit echo signal also causes a ripple in the time delay or phase variation with frequency characteristic, as shown in curve C in FIG. 3. It will be appreciated that, for most applications of filters, these ripples in the filter characteristics are most undesirable.

In accordance with the present invention, the filter includes a second output transducer 16 located on the same substrate 14 as the input transducer 10 and the first output transducer 12, and preferably spaced from the input transducer by approximately three times the spacing, d, between the input transducer and the first output transducer. Thus, the additional output transducer 16 will receive acoustic energy from the input transducer 10 after a delay equal to the triple transit delay of the spurious or unwanted signal. The characteristics of the additional output transducer 16 are such that the received signal is slightly greater in amplitude than the triple transit component derived from the first output transducer. The insertion loss of the transducer pair comprising the input transducer 10 and the second output transducer 16 can be conveniently adjusted by interposing an acoustic absorber (not shown) between the two transducers to provide the desired insertion loss.

The output signal from the additional output transducer 16 is connected by line 17 to an adjustable attenuator 18, the output from which, on line 19, is connected, in turn, to an adjustable phase-shifting device 20. The output from the phase-shifting device 20 is applied over line 21 to one terminal of a summing circuit 22, the other terminal of which is supplied over line 23 with an output signal from the first output transducer 12. The transducer output signal on line 17 is attenuated by the attenuator 18, which is adjusted to provide a signal amplitude closely approximating that of the triple transit echo signal component present on line 23 from the normal output transducer 12. Adjustment is also made to the phase shifting device 20, to provide a signal of opposite phase to that of the triple transit echo signal. Thus, a signal can be obtained, on line 21, with essentially the same amplitude as the triple transit echo signal received by the normal output transducer, but with the opposite phase. Consequently, in the summing circuit 22 the signal fed forward over line 21 will essentially cancel the triple transit echo signal received over line 23 from the normal output transducer. A suppressed triple transit output signal will therefore be supplied over output line 24.

Figure 2:
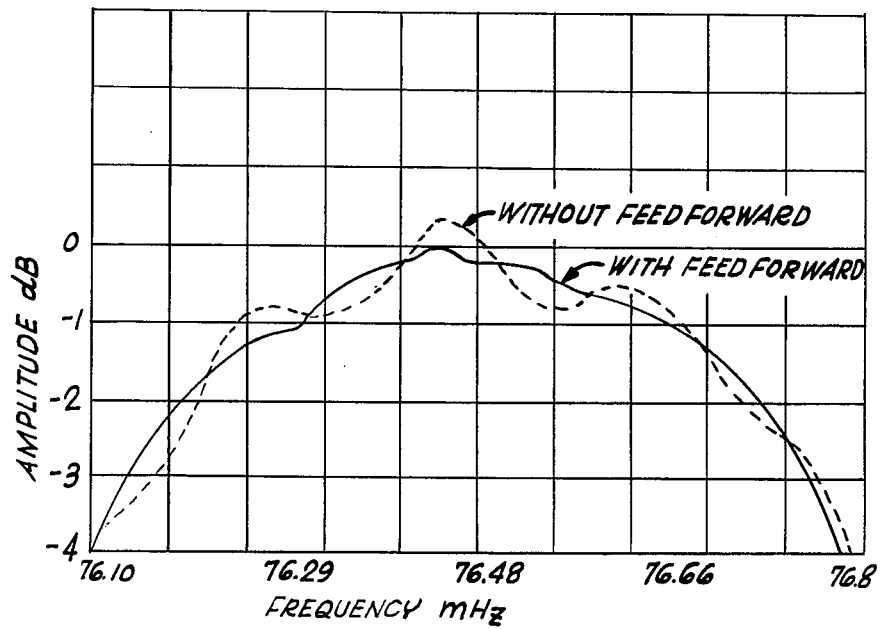
FIG. 2 is a set of two graphs showing the amplitude-versus-frequency response of a surface acoustic wave bandpass filter, with and without utilization of the present invention.
Figure 3:
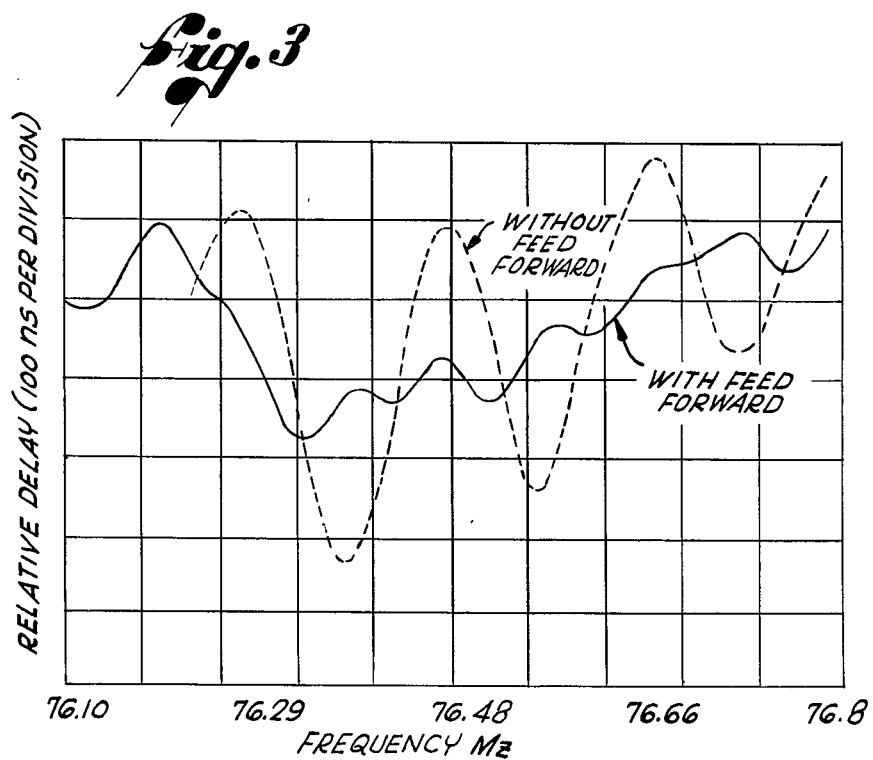
FIG. 3 is a set of two graphs showing the time-delay-versus-frequency characteristic of a surface acoustic wave bandpass filter, with and without utilization of the present invention.
Figure 4:
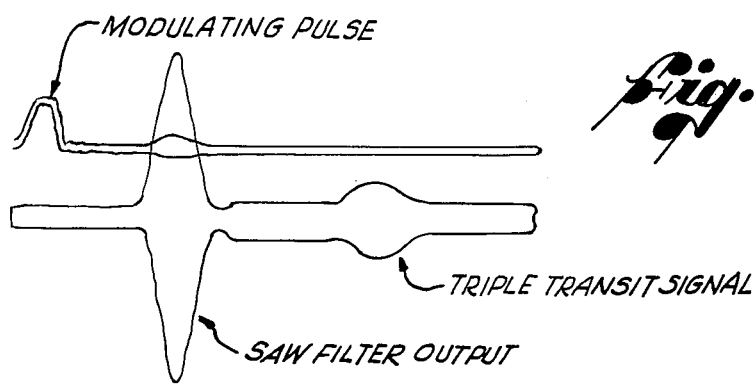
FIG. 4 is a graphic representation of the envelope of the response signal obtained upon application of a modulating pulse to a surface acoustic wave bandpass filter.
Figure 5:
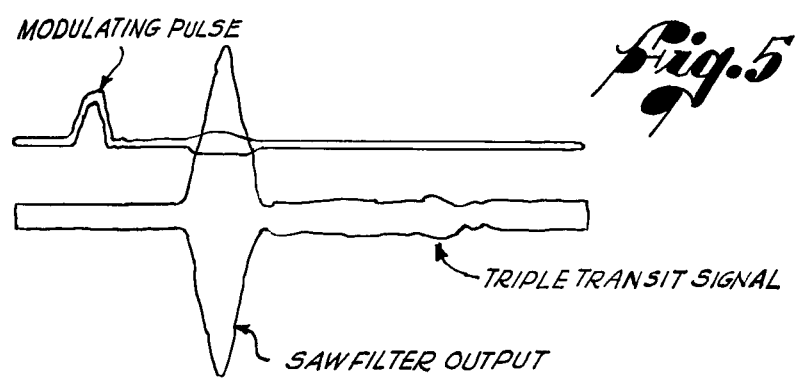
FIG. 5 is a graphic representation similar to FIG. 4, obtained upon application of the same modulating pulse to the same filter, but with the triple transit signal suppressed in accordance with the present invention.

The results obtained by employing the feedforward circuit of the invention are indicated in curve B of FIG. 2, showing a marked improvement over the ripple effect present in curve A. Similarly, curve D of FIG. 3 shows a marked improvement over the ripple in time delay variation shown in curve C. FIGS. 2 and 3 relate to a 76.5 MHz filter fabricated on a quartz substrate. FIGS. 4 and 5 show the corresponding improvement derived from suppressing the triple transit signal when a 277 MHz filter, fabricated on lithium niobate ($LiNbO_3$), is subjected to a modulating pulse.

It will be appreciated from the foregoing that the present invention represents a significant advance in the field of acoustic wave filter design. In particular, it provides substantial reduction in the triple transit effect in such filters, without any corresponding reduction in insertion loss of the filter. The invention is equally well suited for application to filters employing surface acoustic waves and to those employing sub-surface waves, sometimes referred to as shallow bulk waves or surface-skimming bulk waves. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. An acoustic wave filter device in which the effects of triple transit echo are substantially reduced, said device comprising:
   a piezoelectric substrate;
   an input transducer disposed on said substrate, to which an alternating electric signal is applied;
   a first output transducer disposed on said substrate at a distance d from said input transducer, to receive acoustic waves propagated from said input transducer and to convert them to a corresponding electrical output signal;
   a second output transducer disposed on said substrate at a distance of approximately 3d from said input transducer, in a direction opposite to the direction of the first output transducer;
   electrical attenuation means coupled to said second output transducer, to adjust the amplitude of the signal generated at said second output transducer;
   electrical phase-shifting means coupled to said second output transducer, to adjust the phase of the signal generated at said second output transducer to be opposite to the phase of a triple transit signal component contained in the output signal from said first output transducer; and
   signal summing means, to add the output signal from said first output transducer and the phase-shifted and attenuated output from said second output transducer, to produce a suppressed-triple-transit output signal.

2. An acoustic wave filter device as set forth in claim 1, and further including means for attenuating acoustic signals between said input transducer and said second output transducer, to provide a signal amplitude at said second output transducer comparable with but greater than the amplitude of the triple transit component of the output signal from the first output transducer.

3. An acoustic wave filter device comprising:
   a piezoelectric substrate;
   an input transducer and a first output transducer, both disposed on said substrate;
   a second output transducer also disposed on said substrate to receive acoustic waves from said input transducer;
   means for adjusting the phase and amplitude of an output signal derived from said second output transducer to be in correspondence with the phase and amplitude of a triple transit component of the output signal obtained from said first output transducer; and
   means for subtracting the phase-and-amplitude-adjusted output signal derived from the second output transducer, from the output signal obtained from the first output transducer, to obtain a corrected output signal with its triple transit component substantially suppressed;
   and wherein said second output transducer is spaced from said input transducer by approximately three times the distance of said first output transducer from said input transducer, to simulate the triple-transit path length of triple-transit echo signals.

4. An acoustic wave filter device comprising:
   a piezoelectric substrate;
   an input transducer and a first output transducer, both disposed on said substrate;
   a second output transducer also disposed on said substrate to receive acoustic waves from said input transducer;
   means for adjusting the phase and amplitude of an output signal derived from said second output transducer to be in correspondence with the phase and amplitude of a triple transit component of the output signal obtained from said first output transducer; and
   means for subtracting the phase-and-amplitude-adjusted output signal derived from the second output transducer, from the output signal obtained from the first output transducer, to obtain a corrected output signal with its triple transit component substantially suppressed;
   and wherein
      said means for adjusting the phase and amplitude include adjustable attenuation means and adjustable phase-shifting means to provide a signal of opposite phase to the triple transit component to be reduced, and
      said means for subtracting operates by adding the oppositely phased signal from said phase-shifting means to the output signal from said first output transducer, to essentially cancel the triple-transit component thereof.

* * * * *